(12) United States Patent
Goto et al.

(10) Patent No.: US 7,227,260 B2
(45) Date of Patent: Jun. 5, 2007

(54) METHOD AND SYSTEM FOR A PAD STRUCTURE FOR USE WITH A SEMICONDUCTOR PACKAGE

(75) Inventors: Yuichi Goto, Austin, TX (US); Eiichi Hosomi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 10/973,735

(22) Filed: Oct. 26, 2004

(65) Prior Publication Data

US 2006/0087028 A1    Apr. 27, 2006

(51) Int. Cl.
*H01L 23/34*    (2006.01)
*H01L 23/48*    (2006.01)
*H01L 23/52*    (2006.01)
*H01L 29/40*    (2006.01)

(52) U.S. Cl. .................. 257/724; 257/786; 257/773; 257/924; 257/E25.015; 361/782

(58) Field of Classification Search ................ 257/786, 257/724, 924, 773, 723; 361/782, 738
See application file for complete search history.

(56) References Cited

U.S. PATENT DOCUMENTS 5,010,447 A * 4/1991 Wallace ...................... 361/782
6,300,677 B1 * 10/2001 Salem ......................... 257/691
6,664,628 B2 * 12/2003 Khandros et al. ........... 257/723
6,900,991 B2 * 5/2005 Patel et al. .................. 361/782

FOREIGN PATENT DOCUMENTS

JP    1994-44169    6/1994
JP    2002-359450   12/2002

OTHER PUBLICATIONS

AVK Corporation, Low Inductance Capacitors Catalogue 0612/0508 IDC, pp. 6 & 7.

* cited by examiner

*Primary Examiner*—Nitin Parekh
(74) *Attorney, Agent, or Firm*—Sprinkle IP Law Group

(57) ABSTRACT

Systems and methods for substrate layers used in attaching devices to a semiconductor package are disclosed. A novel pad structure may be employed on a substrate layer which has pads, each pad having a common electrical potential. Multiple pad openings may be employed on a single pad, allowing the attachment of multiple terminals of one or more decoupling capacitors to a single pad. These pads and pad openings can be arranged according to the type of decoupling capacitor employed, allowing a greater total pad area to be utilized in conjunction with a set of pad openings, while simultaneously allowing the multiple pad openings on the pad to be placed closer together, reducing the ESL and ESR of the path between the semiconductor and the decoupling capacitors, increasing the mechanical reliability of the semiconductor package and allowing a higher density of decoupling capacitors to be coupled to a given area.

9 Claims, 19 Drawing Sheets

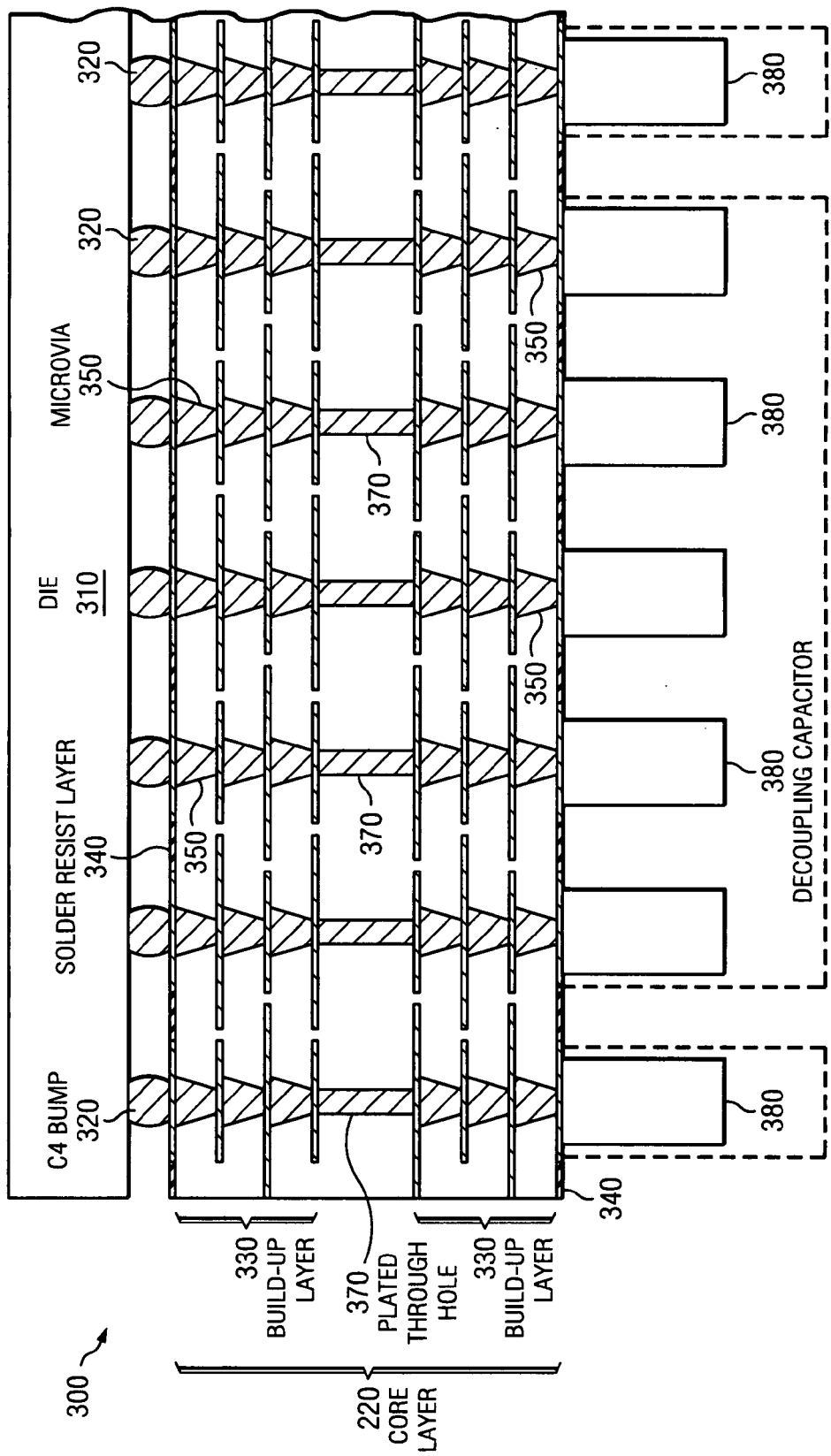

METHOD AND SYSTEM FOR A PAD STRUCTURE FOR USE WITH A SEMICONDUCTOR PACKAGE

TECHNICAL FIELD OF THE INVENTION

The invention relates in general to methods and systems for coupling an apparatus to a semiconductor device, and more particularly, to a pad structure for attaching decoupling capacitors to a semiconductor package.

BACKGROUND OF THE INVENTION

Electronic systems are becoming a staple of modern life. These electronic systems may be very simple systems, such as individual logic gates that are used for simple control circuits, moderately complex systems, such as integrated logic circuits that are used for controllers and embedded processors, or much more complex systems utilized in powerful computing architectures.

Almost universally, the frequency and power requirements for these electronic systems have been increasing. This is especially true when referring to microprocessor based computing systems. Besides the display, the largest consumer of power in a computing system is the CPU microprocessor, and the higher the clock frequency of the microprocessor, the greater that microprocessor's power consumption (all other aspects being equal). As the power consumption and frequency of semiconductor devices grows so does the simultaneous switching noise (SSN) induced by the switching of the internal circuits of the semiconductor's core logic. This SSN is problematic, as it may cause interference with other aspects of the semiconductor's operation, with associated logic in other portions of the semiconductor, or with a device in which the semiconductor is utilized.

An effective way of suppressing this noise is to attach decoupling capacitors to the semiconductor, or a package containing the semiconductor. Because inductance and resistance between a semiconductor and its power source contributes significantly to the SSN, in most cases the closer decoupling capacitors are attached to a semiconductor device the smaller the SSN will be. FIG. 1 depicts a hierarchy of positions for the attachment of decoupling capacitors. Ideally, decoupling capacitors 110 will be coupled as closely to semiconductor 120 on package 130 as possible.

Additionally, the effectiveness of these decoupling capacitors is partially determined by how large the equivalent series inductance (ESL) and equivalent series resistance (ESR) are between the semiconductor and the decoupling capacitors. These factors are influenced, in main, by two variables: the type of decoupling capacitors used, and the path between these capacitors and the semiconductor in question.

To minimize the former variable, various low ESL and ESR decoupling capacitors are available from assorted vendors such as AVX, Murata and TDK. However, to minimize the latter variable is more difficult. Attaching the capacitors close to the semiconductor is one possible solution. To accomplish this, in many cases high-end microprocessors have decoupling capacitors coupled to the bottom side of the package with which they are utilized, usually just beneath the die to which the microprocessor is attached. FIG. 2 depicts one example of a method of attaching decoupling capacitors in close proximity to a semiconductor. Die 310 containing an integrated circuit, such as a microprocessor, is attached to substrate 220. BGA balls 230 serve to couple die 310 to a power source or other signal lines. Decoupling capacitors 380 may also be attached to the side of substrate 220 opposite die 310, placing them in close proximity to die 310.

Typically, substrate 220, with which microprocessors or semiconductors are packaged, is made of organic material (such as epoxy resin). Substrate 220 may be fabricated using build-up technology, which enables higher wiring capability by having fine-line build-up layer(s) on both sides of a coarser core substrate.

FIG. 3 illustrates a cross-sectional schematic of a package with an organic substrate 220. Package 300 consists of die 310 C4 bumps 320 build-up-layers 330, solder resist layers 340, microvias 350, core layer 360, plated through holes 370, and decoupling capacitors 380. Decoupling capacitors 380 are electrically coupled to the remainder of the package through pads in solder resist layer 330 of substrate 220. These pads are usually of a single polarity and are isolated from one another by solder resist. A terminal of decoupling capacitor 380 may be attached to one of these pads, usually by soldering. In package 300, therefore, the electrical path between operating device on die 310 and decoupling capacitors 380 flows through C4 bumps 320, microvias 350, plated through holes 360, microvias 350, pads in solder resist layer 340 to decoupling capacitors 380.

FIGS. 4A, 4B and 4C depict examples of decoupling capacitors for use with a semiconductor package like that pictured in FIG. 2. Decoupling capacitor 400 may have eight terminals 410–480 as pictured in FIG. 4A, and these terminals 410–480 may be of alternating polarity (i.e. interdigitated), as depicted in FIG. 4B. Two capacitors may have terminals with point symmetry to one another as depicted in FIGS. 4B and 4C. As can be seen, identical terminal 410-480 have opposite polarity in these capacitors. In one embodiment, capacitor 400 may be a four capacitor array. In other embodiments, capacitor 400 may be an interdigitated capacitor of the type manufactured by AVX, Murata and TDK.

FIG. 5A shows a typical pad opening layout for use in attaching decoupling capacitor 400 to a substrate. Pad openings 510–580 must be large enough for soldering one terminal 410–480 of decoupling capacitor 400. Recently, however, as the power consumption and frequency of semiconductors has increased, there has been a commensurate need for more decoupling capacitors 400 in a given package 300. Thus, to accommodate a higher density of decoupling capacitors 400, pad openings 510–580 have begun to shrink, as depicted in FIG. 5B. As a result of this shrinking pad opening 510–580 size, the number of microvias 350 contacting pad openings 510–580 has decreased. Not only does this decrease the mechanical reliability of pads and pad openings 510–580, but it also increases the ESR and ESL of the complete electrical path, the very problem trying to be avoided.

To help ameliorate these electrical and mechanical issues, a pad structure akin to the one depicted in FIG. 6 may be used. Pads 610–680 exist in solder resist layer 640. One pad opening 642 exists in each pad 640 for attaching terminals 410–480 of decoupling capacitor 400. One terminal 410–480 is attached to each soldering area of pad opening 612–682 within pad 610–680 having polarity matching terminal 410–480 being attached. Pad openings 612–682 may be defined on pad 610–680 by overlaying a solder mask layer on pads 610–680 during manufacturing of a package.

Using this pad structure, pads have been laid out in a solder resist layer of a substrate as depicted in FIG. 7. Pads 710, 720, 730 having alternating polarity, are laid out in solder resist 740. One pad opening 712, 722, 732 exists within each pad 710, 720, 730 for the coupling of a terminal 410–480 of decoupling capacitor 400 with corresponding polarity. Each pad 710, 720, 730 is separated from every other pad 710, 720, 730 by solder resist 740. Consequently, each pad 710, 720, 730 on substrate has only one pad opening 712, 722, 732.

Decoupling capacitor 400 of the type depicted in FIG. 4A may be attached on the back side of a substrate using this pattern of pads and pad openings with alternating polarity as shown in FIG. 8. Terminals 410–480 of capacitor 400 are attached to pad openings 812–882 of pads 810–880 with matching polarity. This solution, however, conflicts with the need for a high density of decoupling capacitors 400. Pads 810–880 are usually larger than pad openings 812–882 and must be isolated from one another by solder resist 890. Usually, 100–200 microns exists between individual pads 810–880. Consequently, in a given area, decoupling capacitors 400 may only be coupled to a substrate in as close a proximity to one another as the separation between individual pads 810–880 and their corresponding openings 812–882 allow.

Thus, a need exists for mechanically reliable methods and systems for attaching decoupling capacitors to a package which allow a high density of decoupling capacitors to be attached to a package while simultaneously decreasing both the ESL and ESR of the electrical path.

SUMMARY OF THE INVENTION

Systems and methods for substrate layers used in attaching devices to a semiconductor package are disclosed. These systems and methods may improve the electrical path between a semiconductor and a device by decreasing one or both of the ESL and the ESR of the electrical path. A novel pad structure may be employed on a substrate layer which has pads, each pad having a common electrical potential. Multiple pad openings may be employed on a single pad, allowing the attachment of multiple terminals of one or more decoupling capacitors to a single pad. These pads and pad openings can be arranged according to the type of decoupling capacitor employed, including decoupling capacitors with different terminal configurations. These novel pad structures allow a greater total pad area to be utilized in conjunction with a set of pad openings, while simultaneously allowing the multiple pad openings on the pad to be placed closer together, thereby reducing the ESL and/or the ESR of the path between the semiconductor and the decoupling capacitors and increasing the mechanical reliability of the semiconductor package. Additionally, because multiple pad openings within a single pad do not have to be electrically separated they may be placed closer together, and consequently a higher density of decoupling capacitors may be coupled to a given substrate area.

In one embodiment, a substrate layer for use with a semiconductor package comprises a first pad with at least two pad openings and a second pad with at least two pad openings wherein the second pad has a polarity opposite the first pad.

In another embodiment, each pad opening is operable to couple a terminal of a capacitor.

In yet another embodiment, the first pad and the second pad extend the length of the substrate layer, the first pad comprises a first row of pad openings and a second row of pad openings wherein the pad openings in the first row are adjacent the pad openings in the second row, and the second pad comprises a first row of pad openings and a second row of pad openings wherein each pad opening in the first row of pad openings is adjacent a pad opening in the first row of pad openings in the first pad and the second row of pad openings is adjacent the first row of pad openings.

In still another embodiment, the capacitor is non-interdigitated.

In other embodiments, the capacitor is interdigitated.

In still other embodiments, the capacitor has at least two terminals, and a first terminal of the capacitor is coupled to a first pad opening in the first pad and a second terminal is coupled to a first pad opening in the second pad.

In one embodiment, the rows of pads are adjacent to each other such that each pad within a row is aligned with a corresponding pad in each adjacent row, and the corresponding pad in each adjacent row has an opposite polarity.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

FIG. 3 depicts a cross-sectional illustration of a typical semiconductor package including decoupling capacitors.

DESCRIPTION OF PREFERRED EMBODIMENTS

Figure 1:
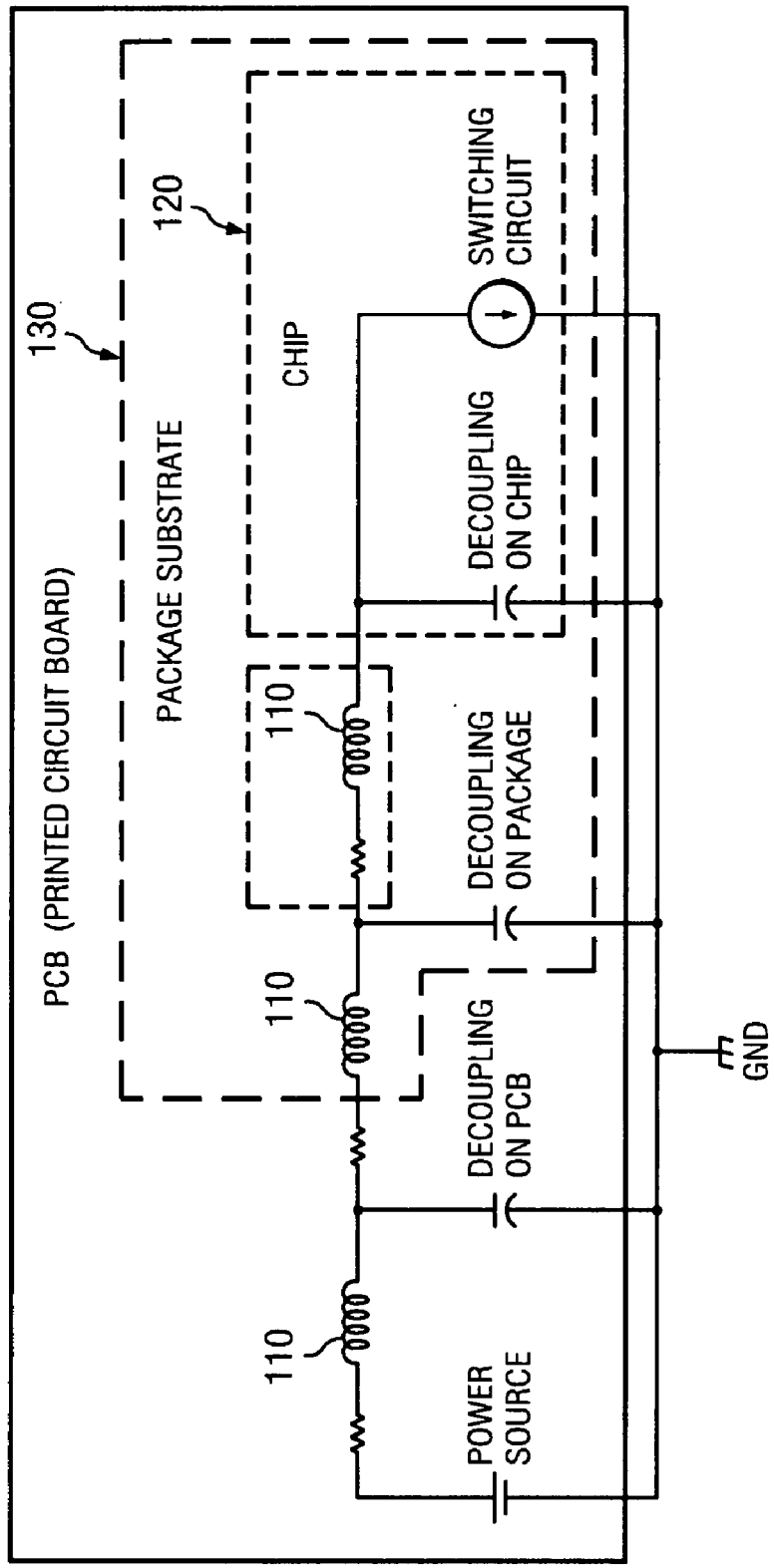
FIG. 1 depicts an illustration of a hierarchy of locations where decoupling capacitors may be attached to a system containing a semiconductor device.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. Skilled artisans should understand, however, that the detailed description and the specific examples, while disclosing preferred embodiments of the invention, are given by way of illustration only and not by way of limitation. Various substitutions, modifications, additions or rearrangements within the scope of the underlying inventive concept(s) will become apparent to those skilled in the art after reading this disclosure.

Reference is now made in detail to the exemplary embodiments of the invention, examples of which are illustrated in the accompanying drawings. Wherever possible, the same reference numbers will be used throughout the drawings to refer to the same or like parts (elements).

A few terms are defined or clarified to aid in an understanding of the terms as used throughout the specification. The term "attach" is intended to mean a physical, electrical or any other type of coupling or any combination of these various types of couplings.

The term "set", when used in the mathematical sense as in "a set of" is intended to mean a collection of zero or more elements.

The term "interdigitated" when used with respect to a decoupling capacitor is intended to mean a decoupling capacitor whose terminals have alternating polarity.

The term "linearly aligned" when used with respect to a set of pad openings means aligned along an axis.

The term "staggered" when used with respect to two pad openings means not directly adjacent to, or aligned with, one another. the term "disposed between" when used with respect to three pad openings means at least one pad opening is not aligned with the other two pad openings on at least one axis.

The term "point symmetrical" when used with respect to two decoupling capacitors means these decoupling capacitors have the same terminal layout, however the polarity of the same respective terminals on each decoupling capacitor are opposite one another.

Attention is now directed to systems and methods for substrate layers used in attaching devices to a semiconductor package. These systems and methods may improve the electrical path between a semiconductor and a device by decreasing one or both of the ESL and the ESR of the electrical path. These systems and methods may be especially useful in physically or electrically attaching a high density of decoupling capacitors to a semiconductor package in close proximity to the semiconductor. A novel pad structure may be employed on a substrate layer which has pads, each pad having a common electrical potential. Multiple pad openings may be employed on a single pad, allowing the attachment of multiple terminals of one or more decoupling capacitors to a single pad. These pads and pad openings can be arranged according to the type of decoupling capacitor employed, including decoupling capacitors with different terminal configurations.

These novel pad structures allow a greater total pad area to be utilized in conjunction with a set of pad openings, while simultaneously allowing the multiple pad openings on the pad to be placed closer together. A greater total pad size allows a larger number of microvias to be placed between the pad and an internal build-up layer, this can reduce the ESL and ESR of the path between the semiconductor and the decoupling capacitors because this greater pad area is usually covered with solder mask (except the pad openings/terminal connections), this novel pad structure may also exhibit increased mechanical reliability. Additionally, because multiple pad openings within a single pad do not have to be electrically separated they may be placed closer together, and consequently a higher density of decoupling capacitors may be coupled to a given area.

Figure 4A:
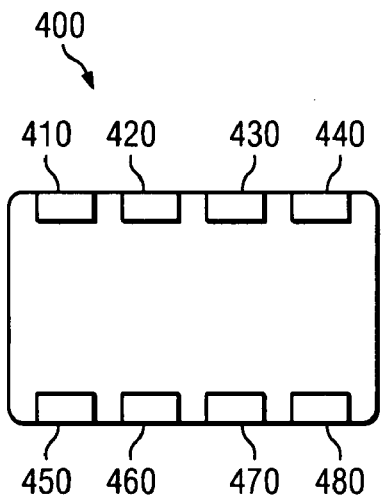
FIG. 4A depicts a representation of one embodiment of a decoupling capacitor.
Figure 5A:
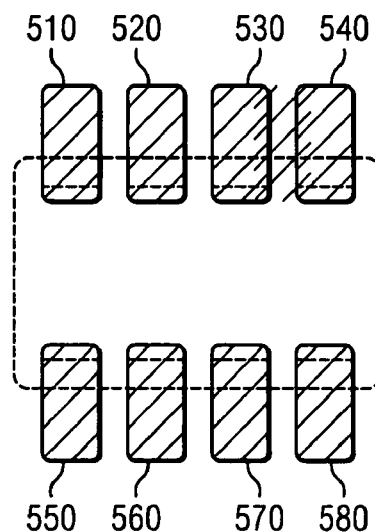
FIGS. 5A and 5B depict a representation of pad layouts suitable for use with the decoupling capacitor represented in FIG. 4A.
Figure 4B:
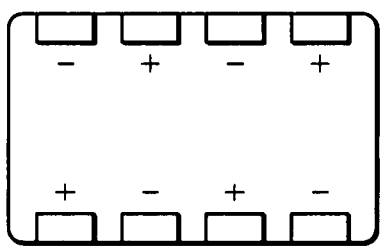
FIGS. 4B and 4C represent two possible arrangements of the terminals of the decoupling capacitor depicted in FIG. 4A.
Figure 5B:
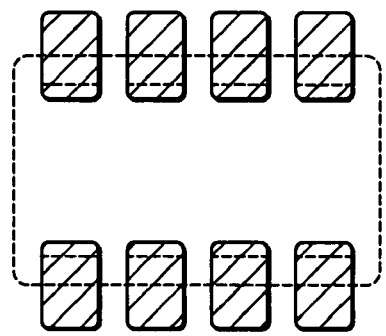
Figure 4C:
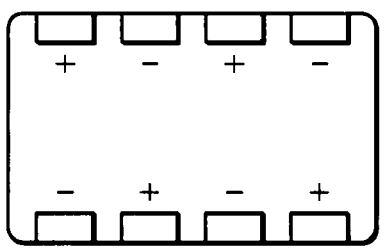
Figure 6:
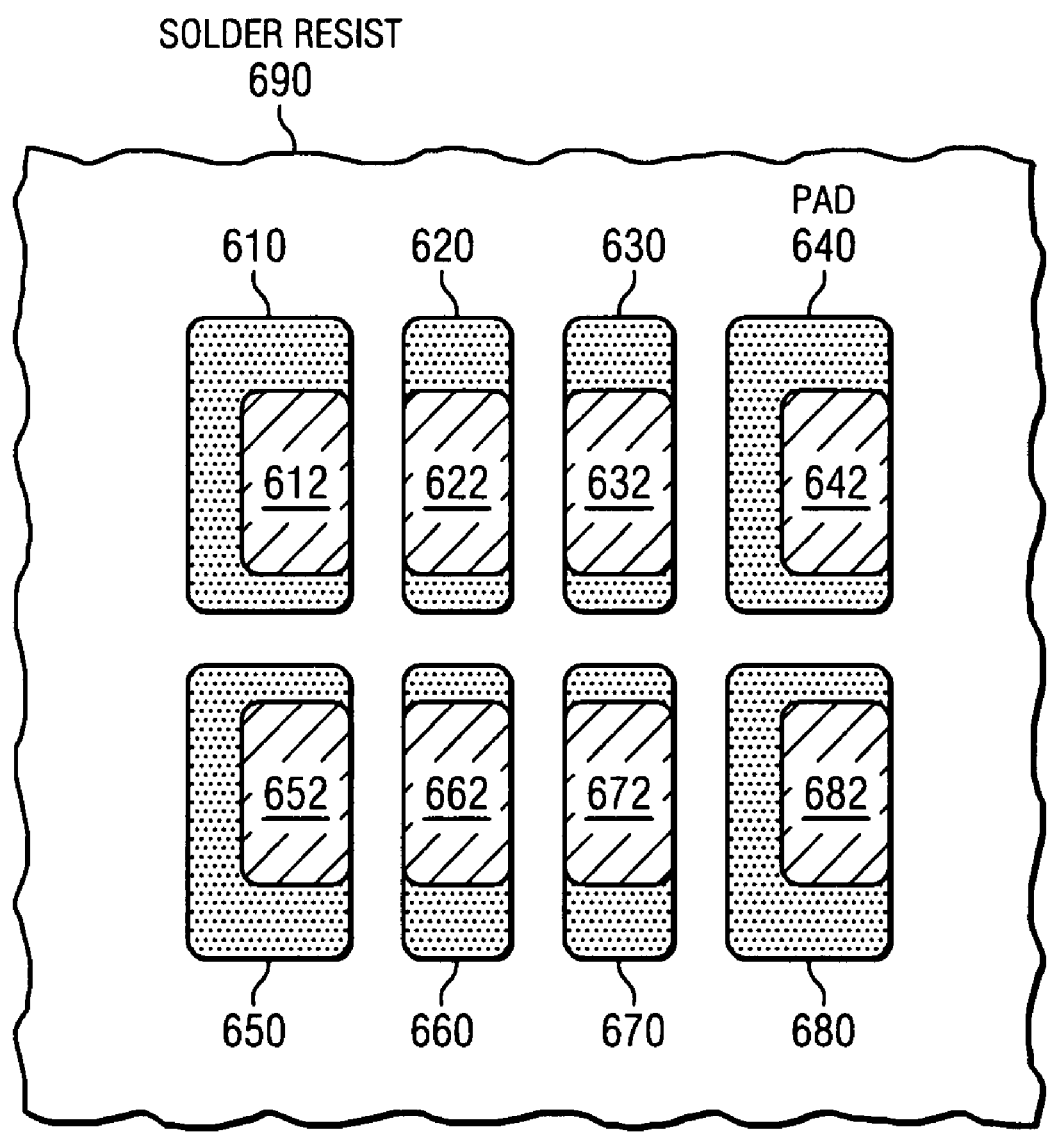
FIG. 6 depicts an illustration of one embodiment of a pad structure.
Figure 9:
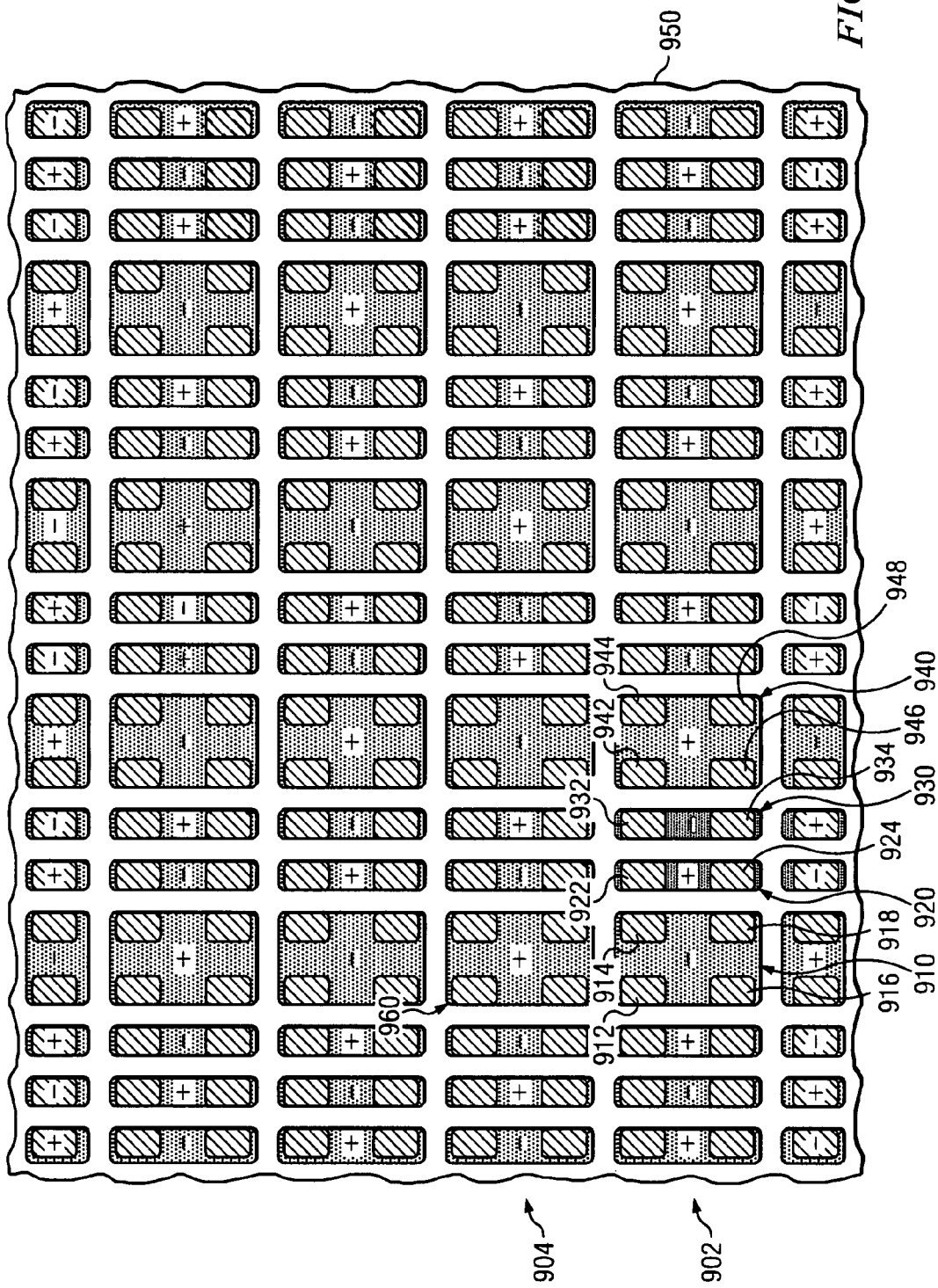
FIG. 9 depicts an illustration of another embodiment of a pad structure.

FIG. 9 depicts one embodiment of a pad layout in accordance with the present invention for use with an eight terminal decoupling capacitor where the polarity of the terminals is point symmetrical, as depicted in FIGS. 4B and 4C. Solder resist layer 950 may have adjacent rows 902, 904 of pads. Each row 902 of pads 910, 920, 930 and 940 may have a pad 910 with four pad openings 912, 914, 916 and 918 and a certain polarity. Proximate to this pad 910 is two pad opening 922, 924 pad 920, having an opposite polarity, and proximate to this two opening 922, 924 pad 920 is another two opening 932, 934 pad 930 having the same polarity as four opening pad 910. Next to this second two opening pad 930 is another four opening 942, 944, 946 and 948 pad 940 having an opposite polarity to the first four opening pad 910. Each pad 910, 920, 930 and 940 within a row 902 may be adjacent to an identical pad with opposite polarity in the adjacent row 904. For example, four opening pad 910 with a negative polarity in row 902 may be adjacent to four opening pad 960 with a positive polarity in adjacent row 904.

Pad openings 912, 914, 916 and 918, 922, 924, 932, 934, 942, 944, 946 and 948 within pads 910, 920, 930 and 940, are used for attaching terminals 410–480 of decoupling capacitor 400 with a polarity matching the pad 910, 920, 930 and 940 in which pad openings 912, 914, 916 and 918, 922, 924, 932, 934, 942, 944, 946 and 948 exist. For example, pad 910 may have a negative polarity and pad opening 914 within pad 910 that is operable to attach terminal 450 of decoupling capacitor 400 in the case where the polarity of terminals 410–480 is arranged as in FIG. 4B. To continue with the above example, pad 920 may have a positive polarity and pad opening 922 within pad 920 that is operable to attach terminal 460, pad 930 may have a negative polarity and pad opening 932 within pad 930 that is operable to attach terminal 470 and pad 940 may have a positive polarity and pad opening 942 within pad 940 that is operable to attach terminal 480.

Each pad 910, 920, 930 and 940 may have multiple pad openings 912, 914, 916 and 918, 922, 924, 932, 934, 942, 944, 946 and 948 for the attachment of terminals 410–480. Because multiple openings 912, 914, 916 and 918 may occur on a single pad 910, openings 912, 914, 916 and 918 occurring within this pad 910 do not have to be electrically isolated from one another. In many cases, a 100 to 200 micron separation between pad openings 912, 914, 916 and 918 on a single pad 910 is desirable to keep solder from flowing together during manufacture and possibly creating mechanical reliability issues.

Figure 7:
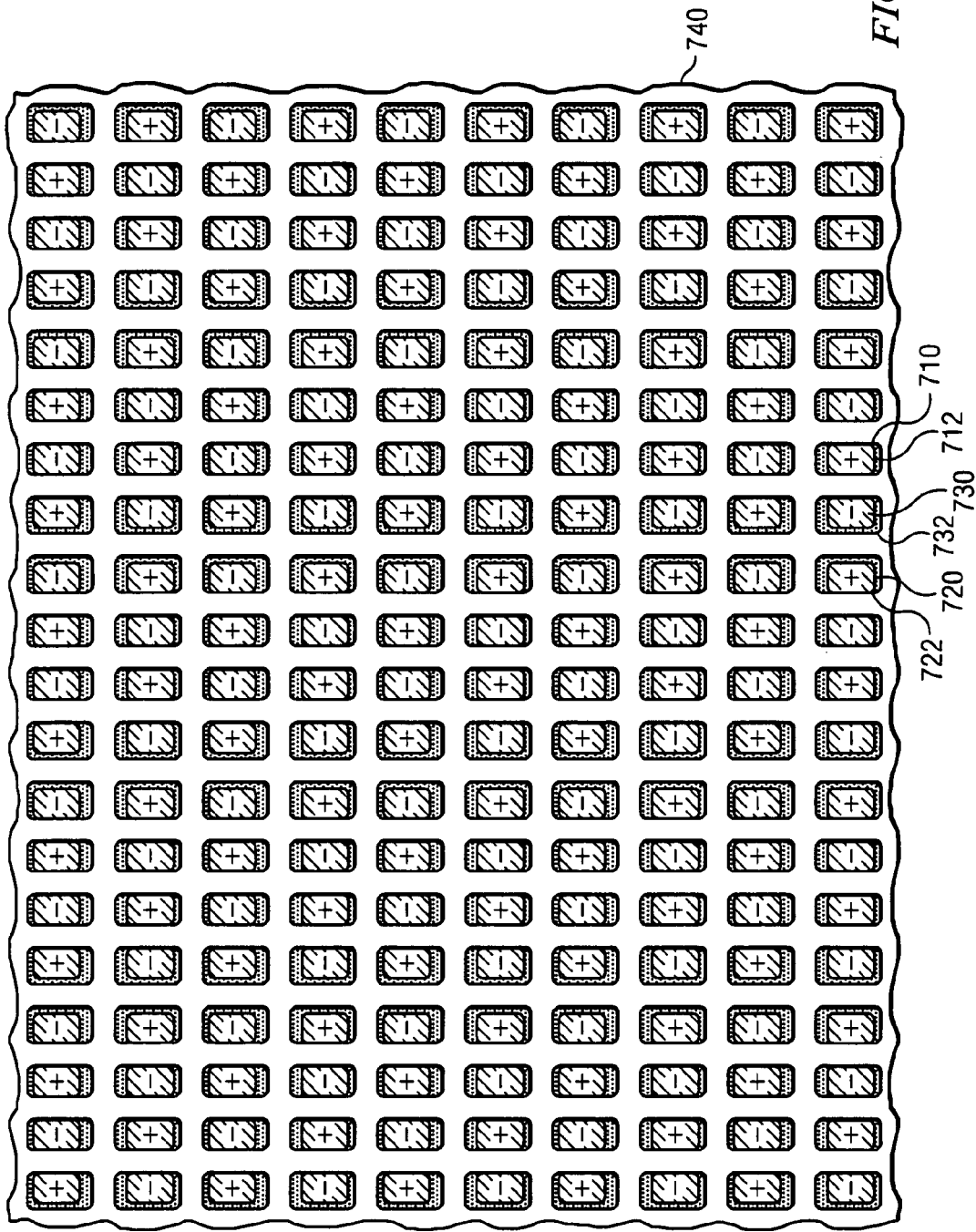
FIG. 7 depicts an illustration of one embodiment of a pad structure.

In any event, however, because each pad has a unique polarity and the multiple openings on any single pad 910, 920, 930 and 940 share the polarity of pad 910, 920, 930 and 940, pad 910, 920, 930 and 940 may encompass pad openings 912, 914, 916, 918, 922, 924, 932, 934, 942, 944, 946 and 948 and any space between openings 912, 914, 916, 918, 922, 924, 932, 934, 942, 944, 946 and 948 in a single pad 910, 920, 930 and 940. Contrast this with openings and pads of FIG. 7, where one opening 722 exists per pad 720, and these pads 710, 720 and pad openings 712, 722 must be electrically isolated from every other pad 710, 720 and pad opening 712, 722. As a result, the area between pad openings 710, 720, formerly consumed by solder resist 740, may instead by devoted to the pad encompassing these openings. It can be seen that in the embodiment depicted in FIG. 9, for any given group of pad openings 922, 924, the pad 920 encompassing this group of openings has a greater area than the collective area of pads 710, 720 encompassing an identical number of pad openings 712, 722 in FIG. 7.

As a result of this greater pad area more micorvias 360 may be placed between any given pad 920 and build-up layer 360, which in turn lowers the ESL and ESR of the path between die 310 and decoupling capacitors 400. By the same token, however, because pad openings 912, 914, 916 and 918, 922, 924, 932, 934, 942, 944, 946 and 948 share pad 910, 920, 930 and 940 and the polarity of pad 910, 920, 930 and 940, pad openings 912, 914, 916 and 918, 922, 924, 932, 934, 942, 944, 946 and 948 which share pad 910, 920, 930 and 940 may be placed closer to one another than individual pads containing a single pad opening. This, in turn, allows a higher density of pad openings 912–948 to be clustered in any given area and commensurately, a higher density of decoupling capacitors 400 may be attached to substrate 220 when these decoupling capacitors 400 are attached to these pad openings 912–948. In some embodiments, because pads 910, 920, 930 and 940 are larger and pads 910, 920, 930 and 940 are covered by solder mask except for where the terminals are actually soldered to pad openings 912–948, the new structure is also better from a mechanical reliability standpoint.

It will be apparent to those of skill in the art that the enumerated advantages will accrue no matter the shape of a pad opening, number of pad openings on the pad or size of the substrate on which these pad structures are used. For example, pad 910 having pad openings 912, 914, 916 and 918 will exhibit all the mechanical, physical and electrical advantages of pad 920 having pad openings 922, 924 and similarly allow the coupling of a higher density of decoupling capacitors.

By making the polarity line of decoupling capacitors 400 symmetrical to the next capacitor (as pictured in FIGS. 4B and 4C), the terminals of decoupling capacitors 400 may be aligned in such a manner that terminals of multiple decoupling capacitors 400 can be attached to pad openings 912–948 within a single pad. For example, pad 910 has four pad openings 912, 914, 916 and 918 suitable for attaching four terminals of four different capacitors 400. By making the polarity line of capacitors 400 point symmetrical to one another one terminal 410–480 of four different decoupling capacitors 400 may be attached to each pad opening 912, 914, 916 and 918 within a pad 910. By having multiple pad openings 912, 914, 916 and 918 in one pad 910, and multiple capacitors 400 sharing these multiple pad openings 912, 914, 916 and 918, a higher density of capacitors 400 may be attached to a given area of substrate 950.

Figure 8:
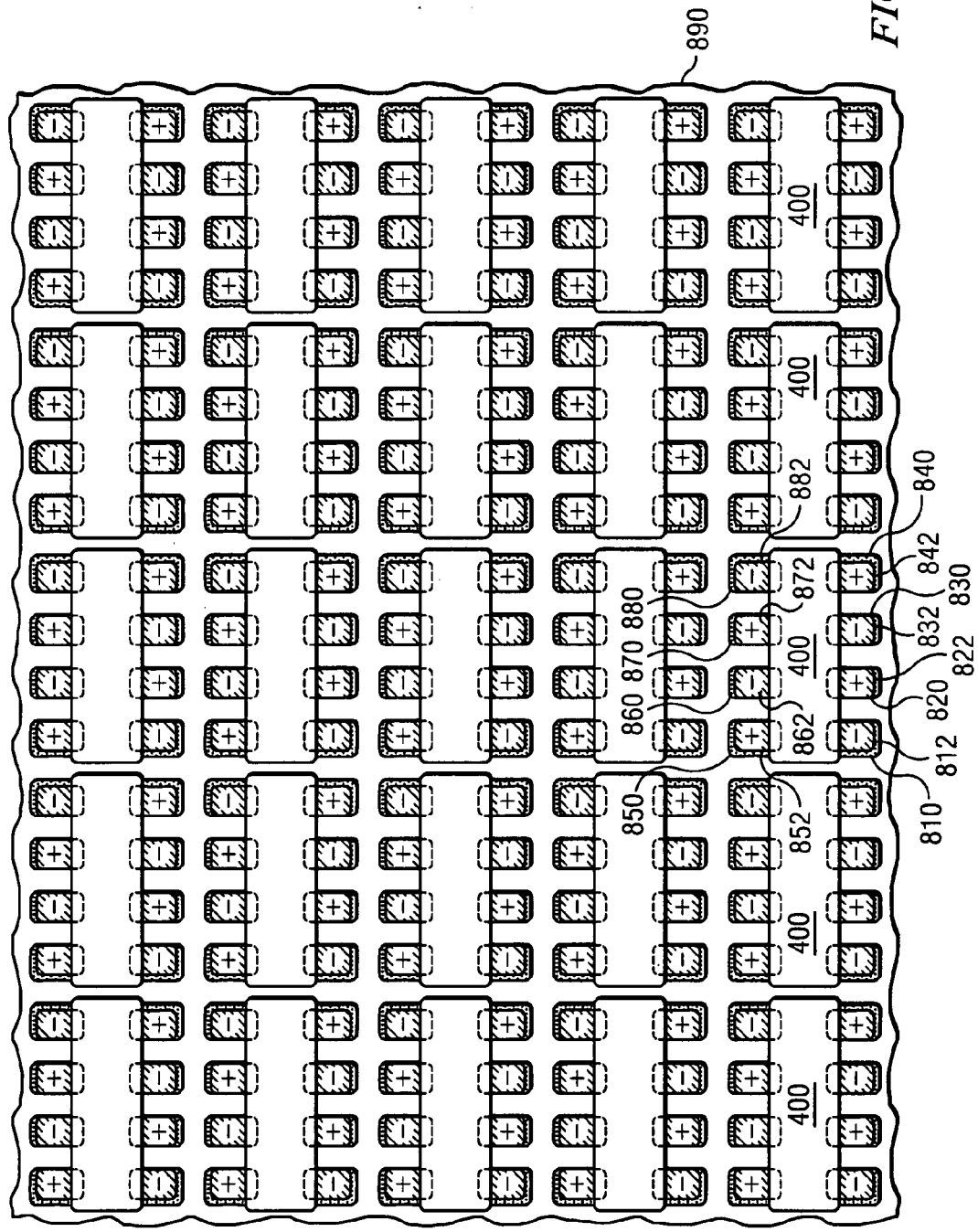
FIG. 8 depicts utilizing the pad structure of FIG. 7 with decoupling capacitor of the type depicted in FIG. 4A.
Figure 10:
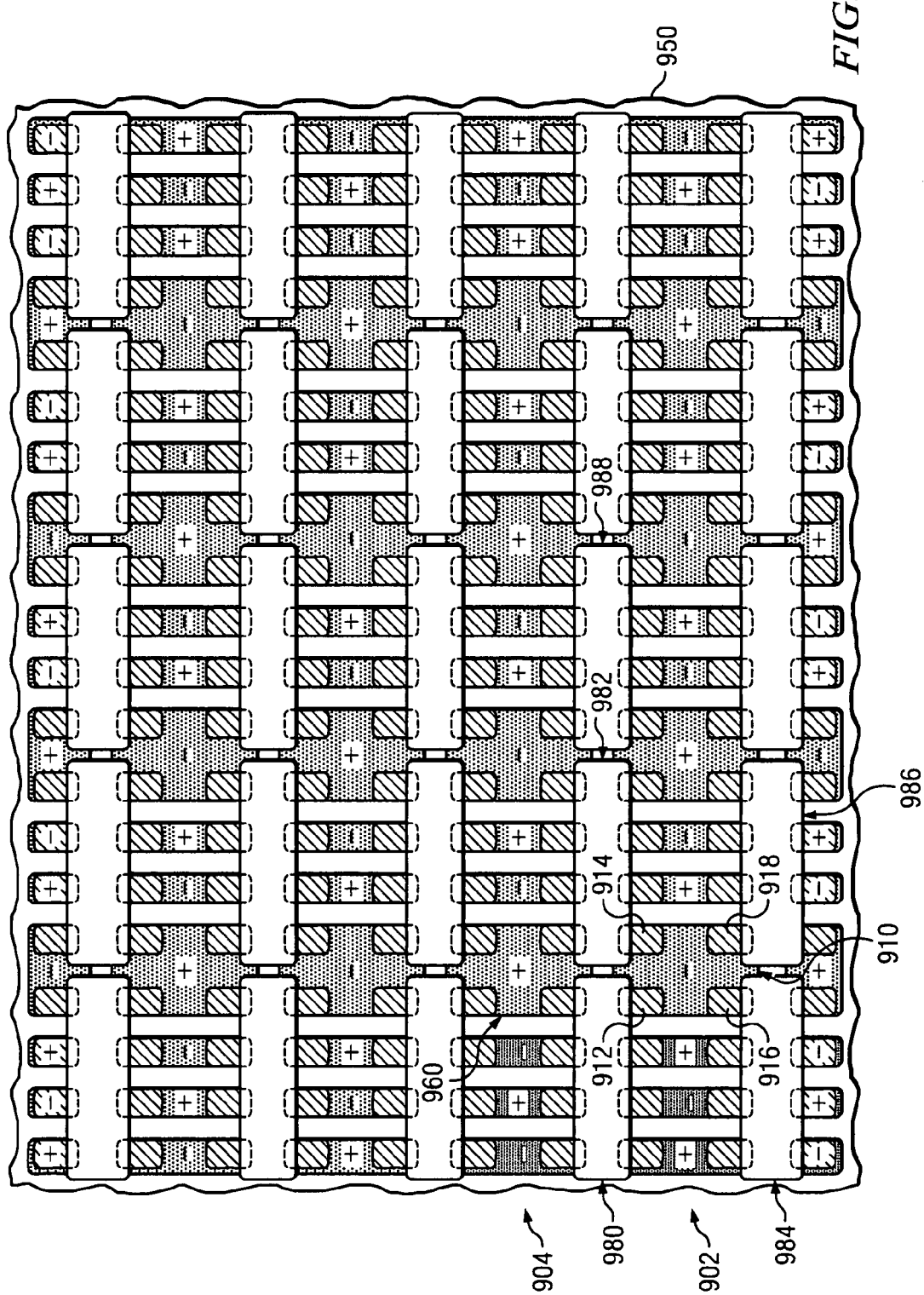
FIG. 10 depicts utilizing the pad structure of FIG. 9 with decoupling capacitors of the type depicted in FIG. 4A.

This arrangement of pads and decoupling capacitors is illustrated in more detail in FIG. 10. As can be seen, pad openings 912, 914, 916 and 918 of pad 910 are each attached to one terminal of decoupling capacitors 980–986. Decoupling capacitors 980, 986, 988 may have terminals arranged like those depicted in FIG. 4B, while decoupling capacitors 982 and 984 may have terminals arranged like those in FIG. 4C. Notice that by repeating the pattern of pads 910, 920, 930 and 940 within a row, by utilizing adjacent rows 902, 904 with adjacent opposite polarity pads 910, 960, pads within a row 902 may be utilized to couple multiple capacitors. For example, terminal 480 of decoupling capacitor 982 may be coupled to pad opening 914 of pad 910 while terminal 410 may be coupled to a pad opening of adjacent pad 960 in adjacent row 904. Using the pad structure depicted in FIG. 9, a higher density of decoupling capacitors may be coupled to the same area using the, as depicted in FIG. 10. This can be seen, for example, when comparing the density of decoupling capacitors 400 of FIG. 8 with decoupling capacitors 980–988 of FIG. 10.

It will be apparent to those of skill in the art after reading this disclosure that traditional manufacturing processes may be utilized to achieve the pad structures disclosed herein. Including masks, photomasks, x-ray masks, mechanical masks, oxidation masks, lithography etc. In some embodiments, during manufacture of package, to avoid shortage and stabilize self-aligning effect during reflowing (soldering) process, solder mask coats the surface except for the pad connecting area.

Again, as mentioned above, the various advantages of the systems and methods of the present invention will accrue no matter what the embodiment of the layout of the pad structure, so long as at least one of the resulting pads contains multiple openings for coupling terminals of a decoupling capacitor. This may be illustrated in more detail by depicting configurations for a variety of decoupling capacitors and embodiments of novel pad structures designed for these configurations. These various embodiments allow for closely grouped pad openings and a resulting high density of decoupling capacitors when they are attached to these pad openings.

Figure 2A:
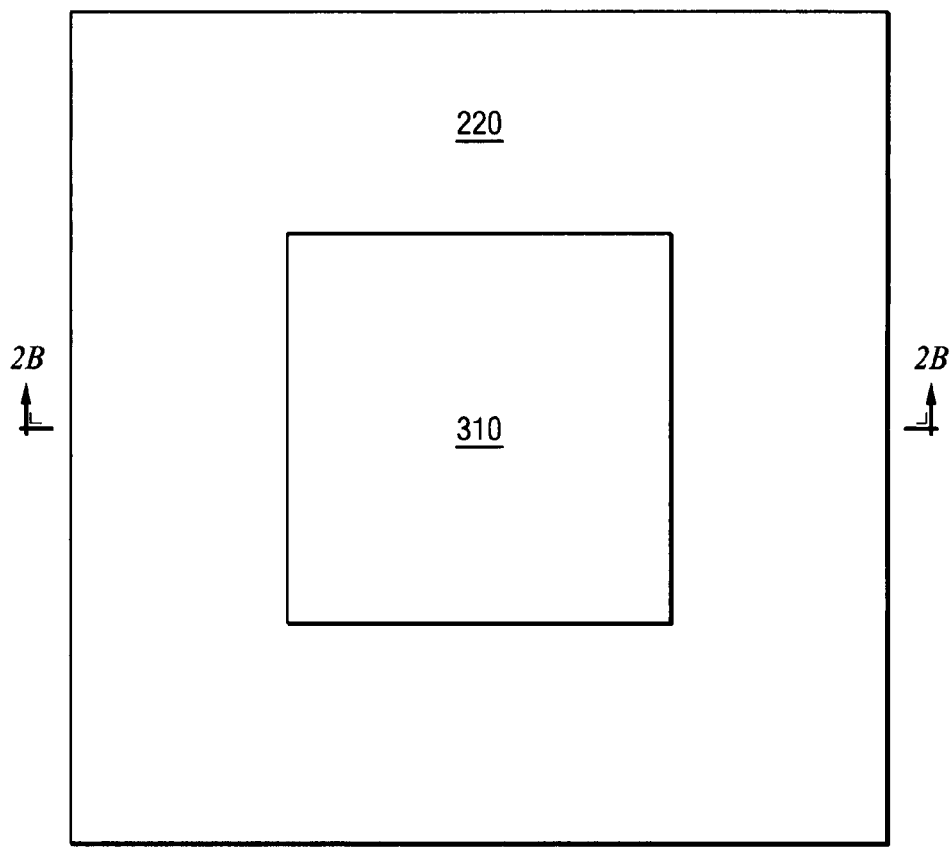
FIG. 2 depicts an illustration of a semiconductor package.
Figure 2B:
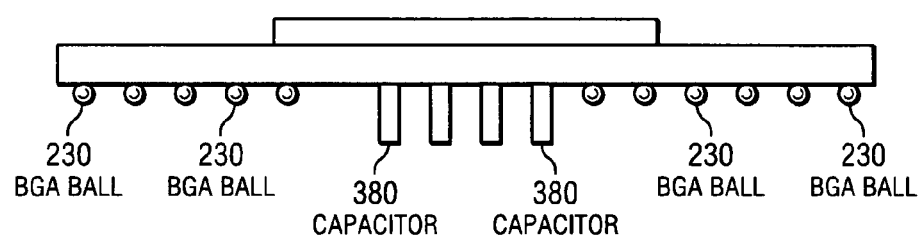
Figure 2C:
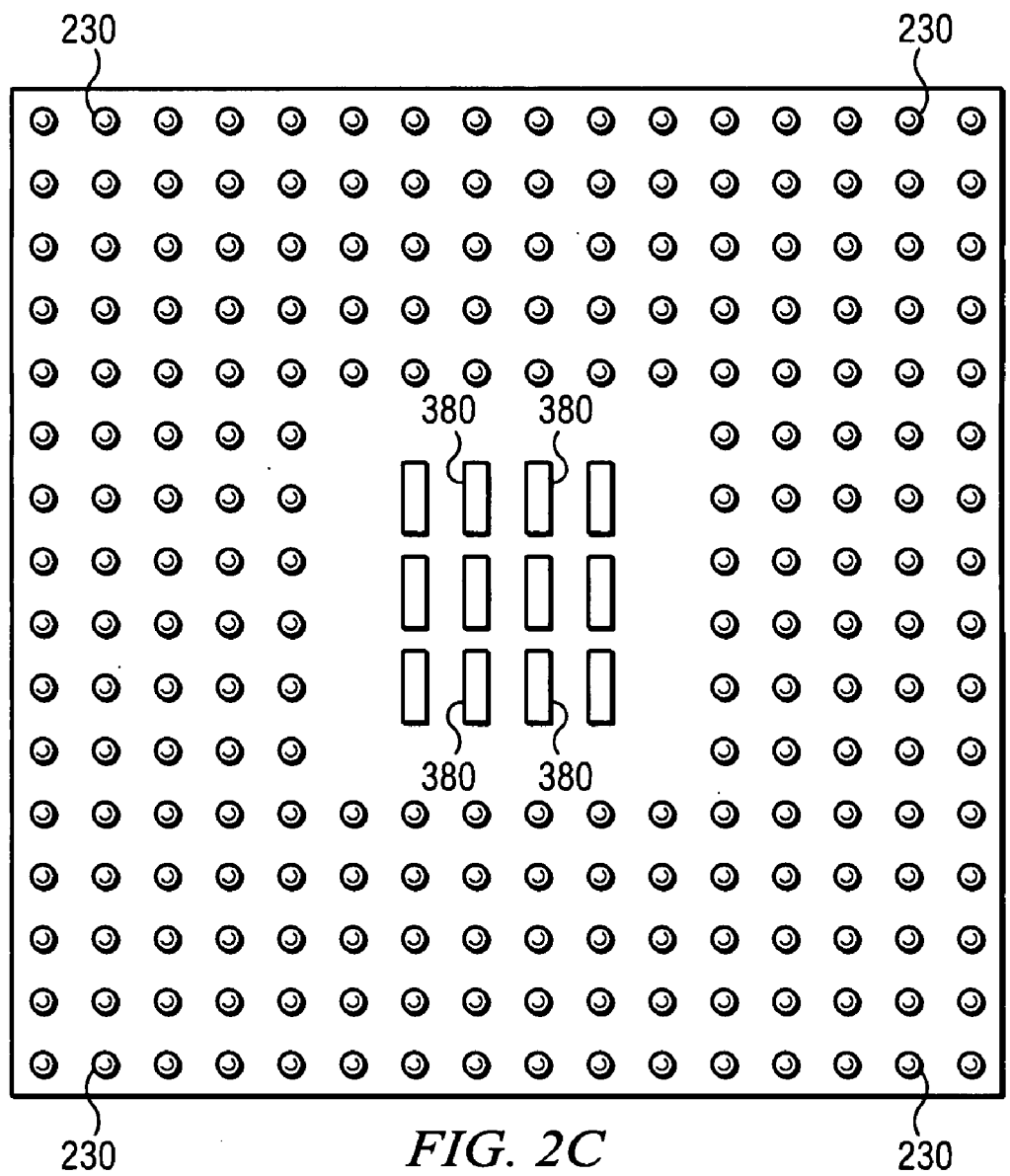
Figure 11A:
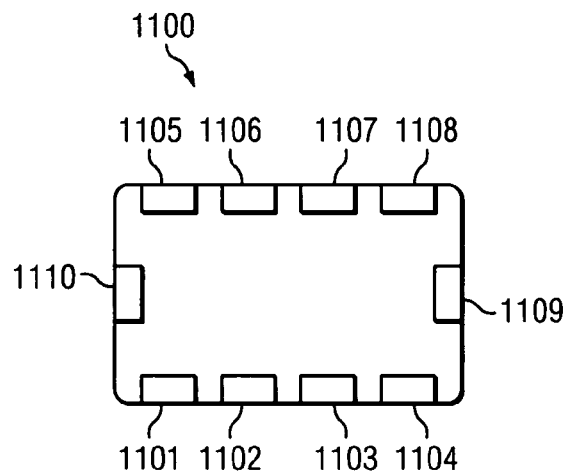
FIG. 11A depicts an illustration of one embodiment of a decoupling capacitor.
Figure 11B:
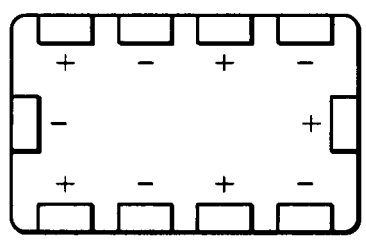
FIGS. 11B and 11C represent two possible arrangements of the terminals of the decoupling capacitor depicted in FIG. 11A.
Figure 12:
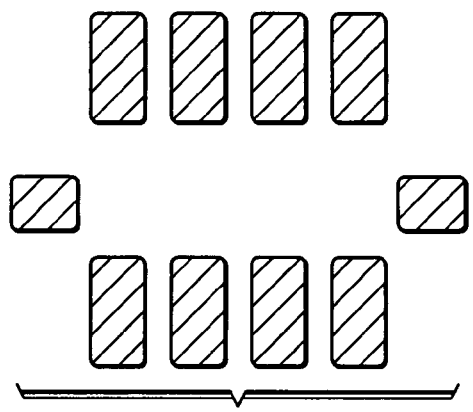
FIG. 12 depicts a representation of an embodiment of a pad layout suitable for use with the decoupling capacitors represented in FIGS. 11B and 11C.
Figure 11C:
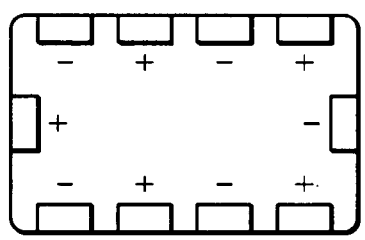

FIGS. 11A, 11B and 11C depict an example of another type of decoupling capacitor for use with a semiconductor package like that pictured in FIG. 2. Decoupling capacitor 1100 may have ten terminals 1101–1110 as pictured in FIG. 11A. These terminals 1101–1110 may be of alternating polarity, as depicted in FIG. 11B and the polarity line of two decoupling capacitors 1100 may be symmetrical to one another (as pictured in FIGS. 11B and 11C). FIG. 12 shows a typical pad opening layout used for attaching decoupling capacitor 1100 to a substrate.

Figure 13:
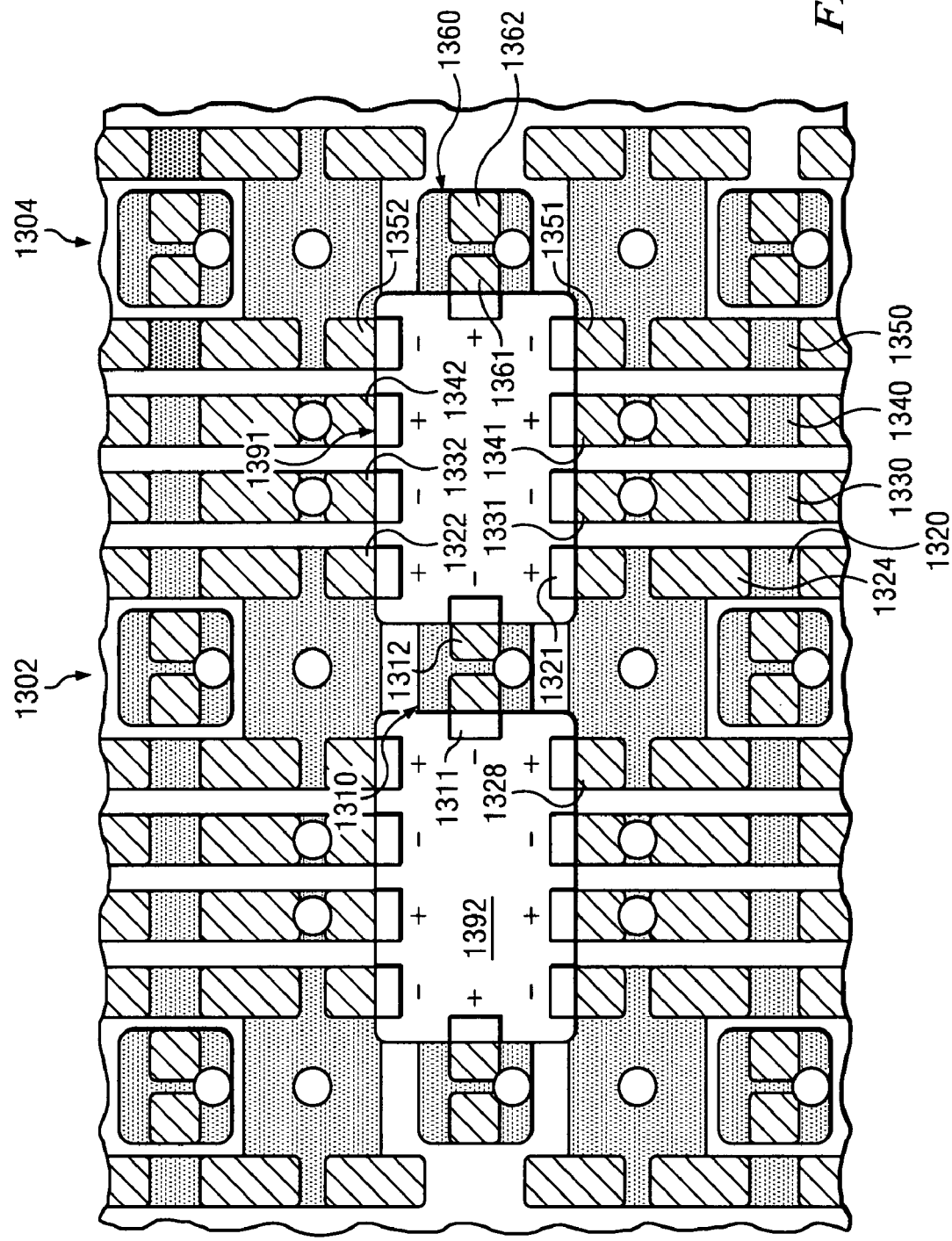
FIG. 13 depicts one embodiment of a pad structure layout for use with the decoupling capacitor represented in FIGS. 11B and 11C.
Figure 14:
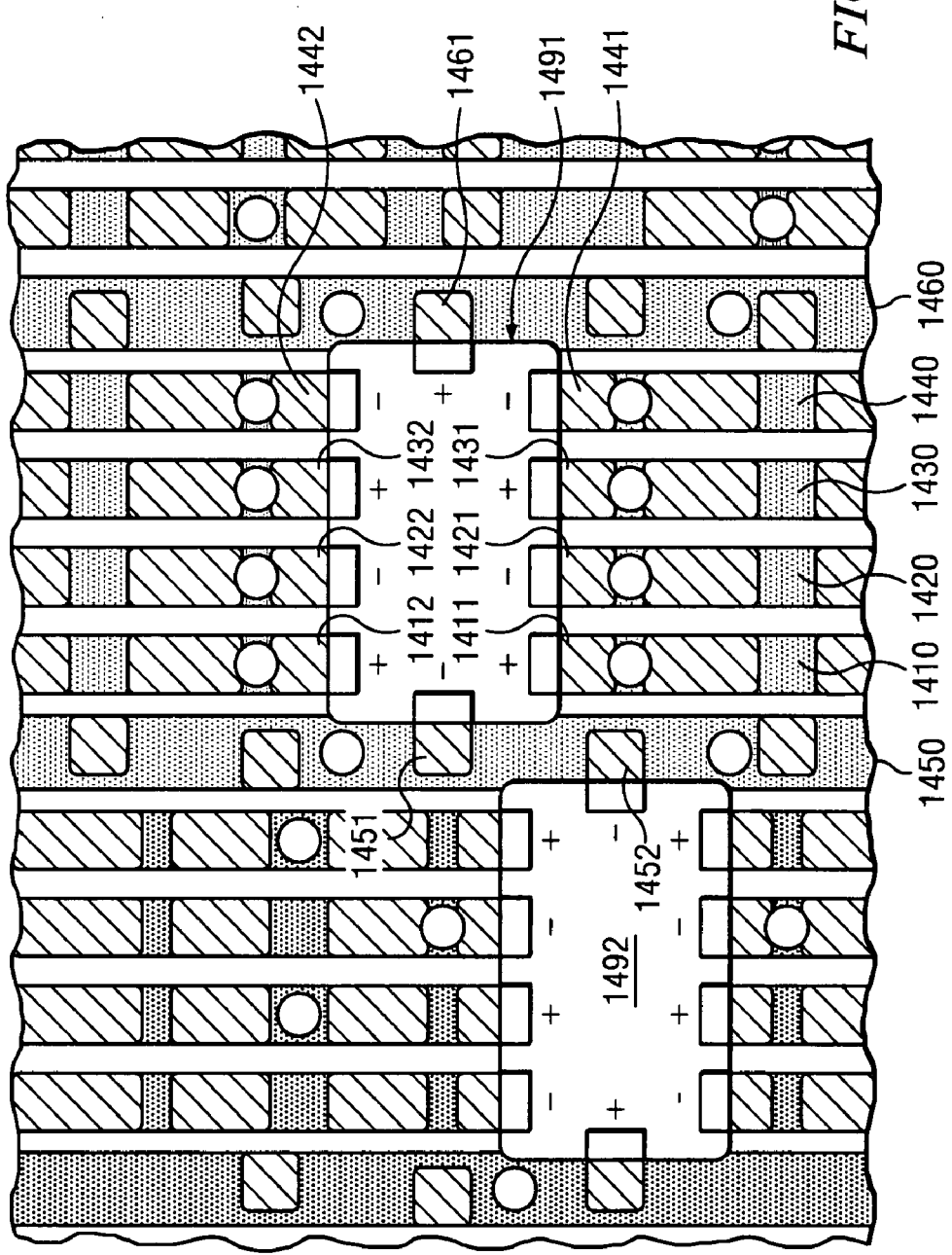
FIG. 14 depicts a second embodiment of a pad structure suitable for use with the decoupling capacitor represented in FIGS. 11B and 11C.

FIGS. 13 and 14 depict embodiments of novel pad structures for allowing a higher density of decoupling capacitors of the type pictured in FIGS. 11A, 11B and 11C to be coupled to a substrate. In one embodiment, depicted in FIG. 13, two rows of pads 1302, 1304 each having a two opening pad 1310, 1360 and a multiple opening pad 1320, 1350, wherein the two opening pad 1302, 1304 has an opposite polarity from, and is surrounded by but not touching, the multiple opening pad 1320, 1350. Between these two rows of pads 1302, 1304 are two adjacent pads 1330, 1340 of opposite polarity having pad openings 1331, 1332, 1341, 1342 arranged linearly within their respective pad 1330, 1340. Each of these pads 1330, 1340 is adjacent to a row of pads 1302, 1304 where the multiple opening pad 1320, 1350 has an opposite polarity. Additionally, pad openings 1321, 1322, 1331, 1332, 1341, 1342, 1351, 1352 in multiple opening pad 1320, 1350 and pads 1330, 1340 may be adjacent one another.

Pad openings 1311, 1312, 1361, 1362 used for attaching end terminals 1110, 1109 of decoupling capacitor 1110 with the same polarity may share a pad, while pad openings used for terminals 1101–1104 and 1105–1008 of the same polarity may share a pad. As can be seen in FIG. 13, pads 1310, 1320 1330, 1340, 1350, 1360 have pad openings 1311, 1321, 1322, 1331, 1332, 1341, 1342, 1351, 1352, 1361 coupled to terminals 1101-1110 of decoupling capacitor 1391. Pads 1310, 1320 1330, 1340, 1350, 1360 may also contain other pad openings for the coupling of other decoupling capacitors 1392. For example, by repeating the pad and row of pad structures, and using another decoupling capacitor 1392 with point symmetry, pad 1310 may also contain pad opening 1312 for the coupling of terminal 1109 of decoupling capacitor 1392, and pad 1320 may contain pad openings 1324 and 1326 for the coupling of terminals of decoupling capacitor 1392.

Pad openings 1321, 1322 and 1326, which are used to couple three different terminals 1101, 1104 and 1105 of two different capacitors, share pad 1320, while pad openings 1311 and 1312 used for coupling end terminals 1109, 1110 of two different decoupling capacitors 1391, 1392, share pad 1310. By virtue of having multiple pad openings sharing a single pad, a greater concentration of microvias 360 may couple these pads to plated through holes 370, providing the mechanical advantages elaborated on with respect to FIG. 9 while allowing a higher density of decoupling capacitors 1100 to be coupled to substrate 220.

Turning now to FIG. 14, another embodiment of a pad structure for use with a decoupling capacitor of the type picture in FIGS. 11A, 11B and 11C which may allow an even higher density of decoupling capacitor to be attached to a substrate is illustrated. In this particular case, pads 1410, 1420, 1430 and 1440 may contain pad openings 1411, 1412, 1421, 1422, 1431, 1432, 1441 and 1442 arranged linearly within their respective pads. Each pad 1410, 1420, 1430 and 1440 is adjacent to another pad 1410, 1420, 1430 and 1440 with an opposite polarity, and pad openings 1411, 1412, 1421, 1422, 1431, 1432, 1441 and 1442 within each pad may be adjacent to pad openings 1411, 1412, 1421, 1422, 1431, 1432, 1441 and 1442 in an adjacent pad. For example, pad 1410 with a positive polarity may be adjacent to pad 1420 having a negative polarity, and pad opening 1411 in pad 1410 may be adjacent to pad opening 1422 in adjacent pad 1420. Pads 1450 and 1460 may contain pad openings 1451, 1452, 1461 staggered with respect to, or disposed between, pad openings 1411, 1412, 1421, 1422, 1431, 1432, 1441 and 1442 of pads 1410–1440, and may be adjacent to a pad 1410-1440 with opposite polarity. For example, pad opening 1451 in pad 1450 with positive polarity is staggered with respect to pad openings 1411, 1412 in pad 1410 with positive polarity.

Staggered pad openings 1451, 1461 allow decoupling capacitors 1491, 1492 to be staggered with respect to one another. This staggering, in turn, allows an even higher density of decoupling capacitors 1491, 1492 to be attached to a substrate. Additionally, the arrangement depicted in FIG. 14 allows pads 1410–1460 to be substantially parallel to one another, easing both the cost and difficulty of manufacturing such a pad structure. By repeating the pad 1410–1460 structure, and using another decoupling capacitor 1492 with point symmetry, pad 1450 may also contain pad opening 1352 for the coupling of terminal 1109 of decoupling capacitor 1492. By virtue of having multiple pad openings sharing a single pad, a greater concentration of microvias 360 may couple these pads to plated through holes 370, providing the mechanical advantages elaborated on with respect to FIG. 9 while allowing a higher density of decoupling capacitors 1491, 1492 to be coupled to substrate 220.

Figure 15A:
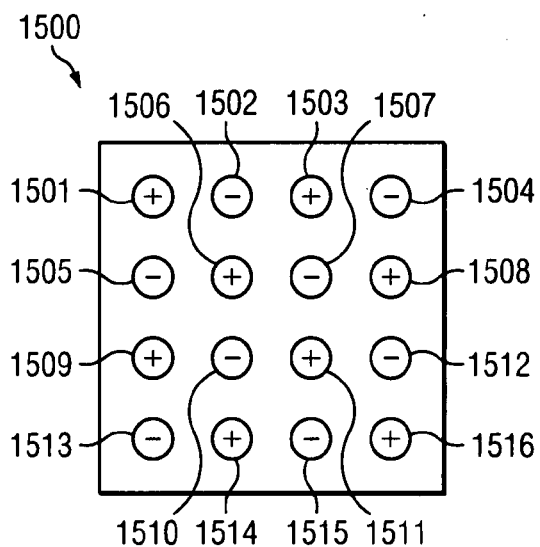
FIG. 15A depicts an illustration of one embodiment of a decoupling capacitor.
Figure 15B:
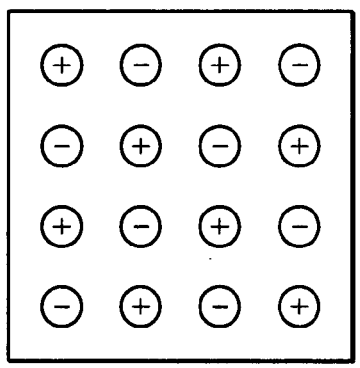
FIGS. 15B and 15C represent two possible arrangements of the terminals of the decoupling capacitor depicted in FIG. 15A.
Figure 16:
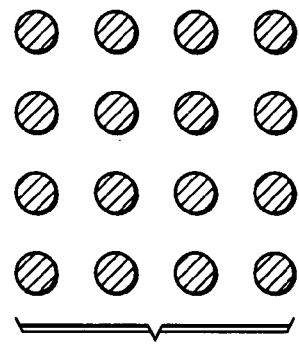
FIG. 16 depicts an illustration of a pad layout suitable for use with the decoupling capacitor illustrated in FIGS. 15B and 15C.
Figure 15C:
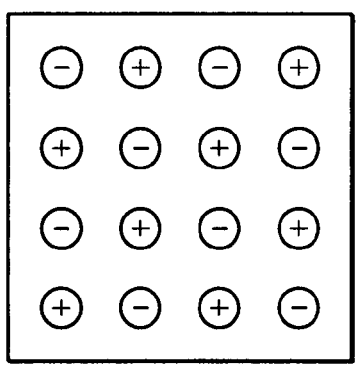

Moving to FIGS. 15A, 15B and 15C, another type of capacitor which may be utilized with embodiments of the present invention is depicted. Capacitor 1500 may be an area array type capacitor with sixteen terminals 1501–1516 arranged in a four by four square. Each terminal 1501–1516 may have a polarity and the polarity line of two decoupling capacitors 1500 may be symmetrical to one another. In one embodiment, the polarity of each of terminals 1501–1516 is like that depicted in FIG. 15B while in another embodiment the polarity of each of terminals 1501–1516 is the inverse, as depicted in FIG. 15C. FIG. 16 illustrates a layout of pad openings for use with decoupling capacitor 1500 of FIGS. 15A, 15B and 15C. In one embodiment, terminals 1501–1516 of capacitor 1500 are a ball grid array as is known in the art.

Figure 17:
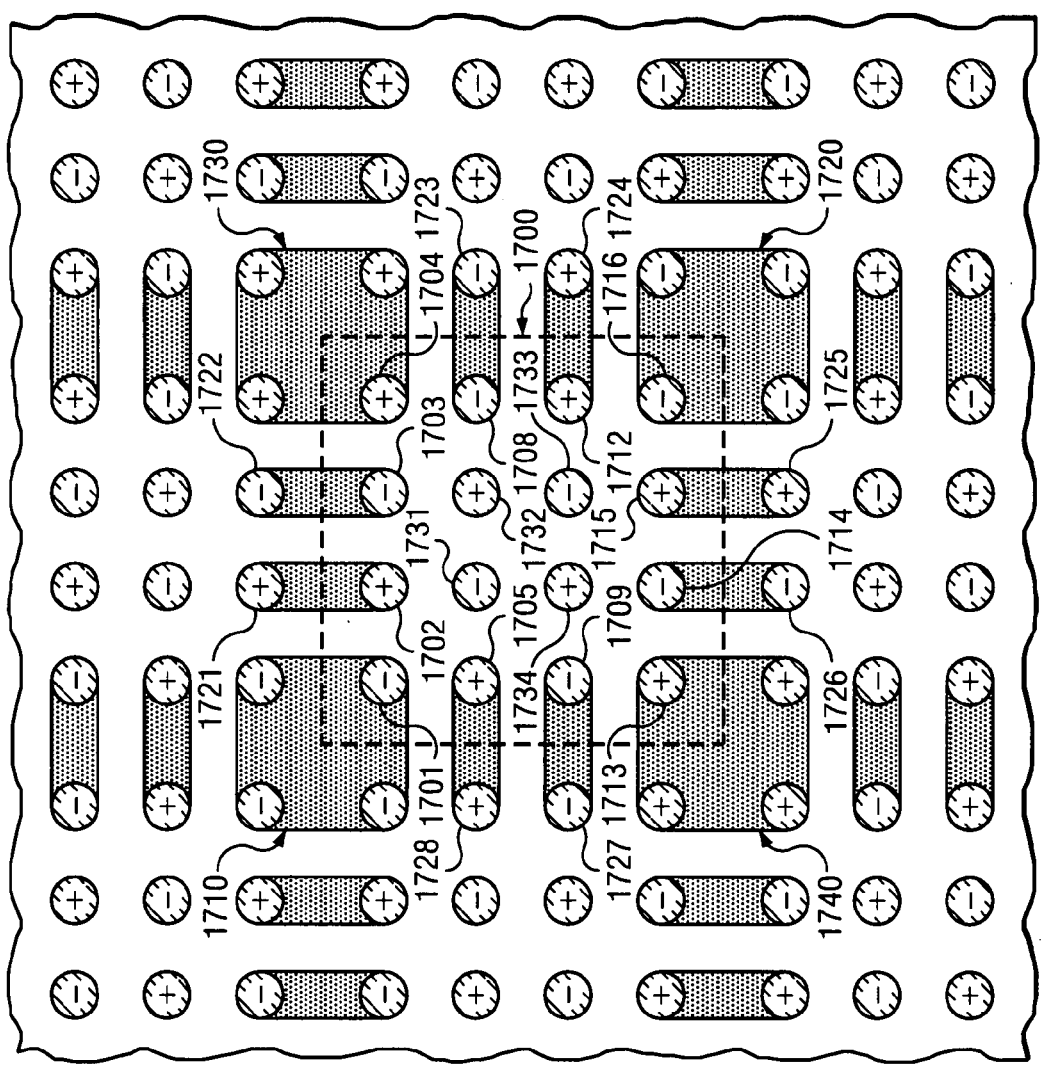
FIG. 17 depicts one embodiment of a pad structure suitable for use with the decoupling capacitor represented in FIGS. 15B and 15C.

FIG. 17 illustrates one embodiment of a pad structure for use with a capacitor of the type depicted in FIGS. 15A, 15B and 15C, which may allow capacitors 1500 to be coupled to a substrate with high density. Square pads 1710, 1720, 1730, 1740 contain four pad openings, while rectangular pads 1721–1728 contain two pad openings. Square pads 1710, 1720, 1730, 1740 may be adjacent to a rectangular pad 1721–1728 of an opposite polarity, which may be adjacent to another rectangular pad 1721–1728 with an opposite polarity from this first rectangular pad 1721–1728. This second rectangular pad may be adjacent to a second square pad 1710, 1720, 1730, 1740 with a polarity opposite the first square pad. For example, square pad 1710 with a negative polarity may be adjacent to rectangular pad 1721 with a positive polarity, which is adjacent to another rectangular pad 1722 with a negative polarity, which is in turn adjacent to a second square pad 1730 with a positive polarity. Square pad 1730 with a positive polarity may be adjacent to rectangular pad 1723 with a negative polarity, which is adjacent to another rectangular pad 1724 with a positive polarity, which is in turn adjacent to a third square pad 1720 with a negative polarity. In turn, square pad 1720 with a negative polarity may be adjacent to rectangular pad 1725 with a positive polarity, which is adjacent to another rectangular pad 1726 with a negative polarity, which is in turn adjacent to a fourth square pad 1740 with a positive polarity. Square pad 1740 with a positive polarity may be adjacent to rectangular pad 1727 with a negative polarity, which is adjacent to another rectangular pad 1728 with a positive polarity, which is in turn adjacent to the first square pad 1710 with a negative polarity.

Square pads 1710, 1720, 1730, 1740 and rectangular pads 1721–1728 may be arranged in this manner such that square pads 1710, 1720, 1730, 1740 are arranged at four corners of a square, with two rectangular pads 1721–1728 between each square pad 1710, 1720, 1730, 1740. Additionally, circular pads 1731–1734 having one pad opening may be located proximate a square pad 1710, 1720, 1730, 1740 with the same polarity.

Pad openings in square 1700 of pad openings may be used for attaching a capacitor of the type depicted in FIG. 14c. Pad openings 1701 and 1716 may have negative polarity for attaching terminal 1501, 1516 of decoupling capacitor 1500. These pad openings may share pads 1710, 1720 with three other pad openings of the same polarity. Similarly, pad openings 1704, 1713 may have positive polarity for attaching terminals 1504, 1513 of decoupling capacitor 1500. These pad openings 1704, 1713 may share pads 1730, 1740 with three other pad openings of the same polarity. Pad openings 1702, 1703, 1705, 1708, 1709, 1712, 1714 and 1715 may share pads with another pad opening of the same polarity. These shared pads offer the same advantages elaborated on above.

As can be seen, pad openings 1700 may accommodate decoupling capacitor 1500 with a terminal arrangement like that depicted in FIG. 15C. Furthermore, by repeating the pad structure explained above capacitors with polarity line symmetry, like those in FIGS. 15B and 15C, may be used so pad openings on the same pad may be grouped more closely, resulting in a higher density of decoupling capacitors attached to these terminals. For example, pad openings in pads 1720, 1740, 1725 and 1726 may accommodate terminals 1501–1504 of decoupling capacitor 1500 with the terminal arrangement depicted in FIG. 15B.

Figure 18A:
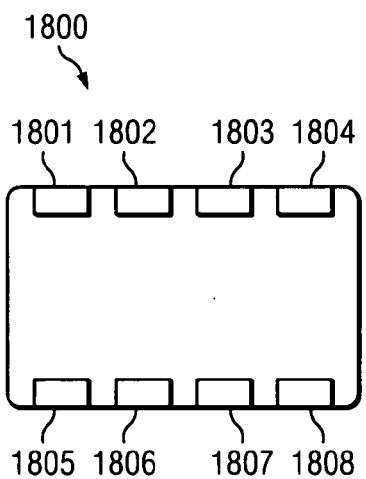
FIG. 18A depicts an illustration of one embodiment of a decoupling capacitor.
Figure 18B:
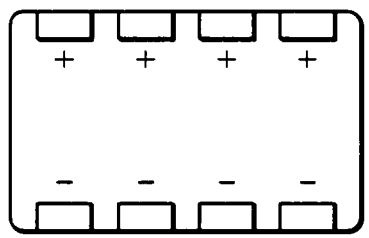
FIG. 18B represents a possible arrangement of the terminals of the decoupling capacitor depicted in FIG. 18A.

Yet another type of decoupling capacitor which may be utilized with the novel pad structures disclosed is depicted in FIG. 18A. Decoupling capacitor 1800 may be an eight terminal decoupling capacitor like that depicted in FIG. 4, however decoupling capacitor may have terminals 1801–1809 which do not alternate in polarity, as depicted in FIG. 18B, known as non-interdigitated capacitor.

Figure 19:
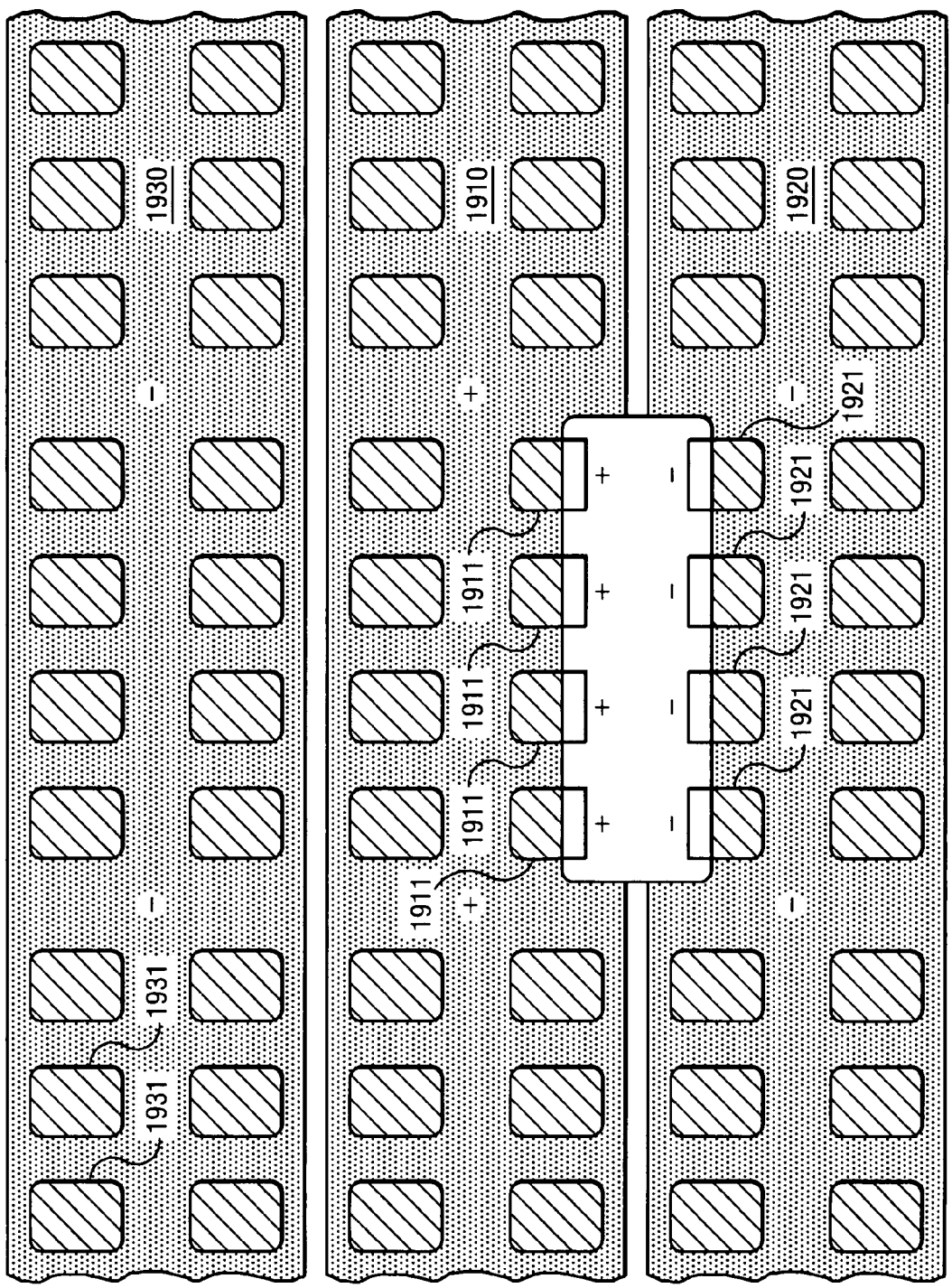
FIG. 19 depicts one embodiment of a pad structure suitable for use with the decoupling capacitor represented in FIGS. 18A and 18B.

FIG. 19 depicts one embodiment of a pad structure for use with this type of decoupling capacitor 1800. Pad 1910 may have a positive polarity and a set of pad openings 1911, while pad 1920 may have negative polarity and a set of pad openings 1921. In one particular embodiment, another pad 1930 may have negative polarity and a set of pad openings 1931. Pad openings 1911, 1921, 1931 within pads 1910–1930 may be arranged in two rows with each pad opening in each row adjacent to another pad in the same row and another pad opening in the other row.

Terminals 1801–1808 of decoupling capacitor 1800 may attach to pad openings in one row of pad openings in one pad and pad openings in one row of pad openings in another pad with opposite polarity. For example, terminals 1801–1804 may attach to pad openings 1911 of positive pad 1910 while terminals 1805–1808 may attach to pad openings 1921 of positive pad 1920. By virtue of having shared pads 1910–1930 pad openings 1911, 1921 may be placed closer to one another allowing a higher density of decoupling capacitors 1800 to be attached to a substrate.

Figure 20A:
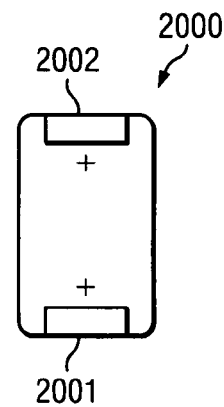
FIG. 20A depicts an illustration of one embodiment of a decoupling capacitor.
Figure 20B:
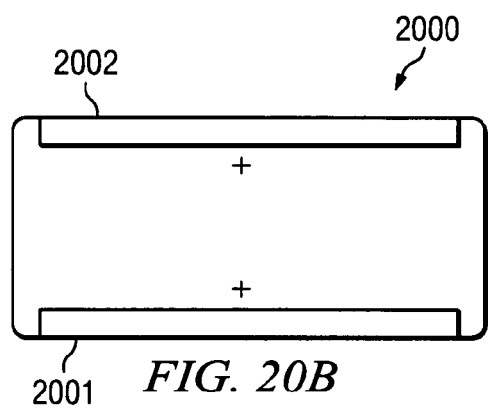
FIG. 20B represents a possible arrangement of the terminals of the decoupling capacitor depicted in FIG. 20A.

FIGS. 20A and 20B disclose other embodiments of a decoupling capacitor. Decoupling capacitor 2000 may have two terminals 2001, 2002. Terminals 2001, 2002 may be utilized with a smaller decoupling capacitor 2000 as depicted in FIG. 20A, or a larger decoupling capacitor 2000 as in FIG. 20B. In one embodiment, the larger decoupling capacitor depicted in FIG. 20B is an array of four decoupling capacitors whose like polarity terminals have been joined to make long terminals.

Figure 21:
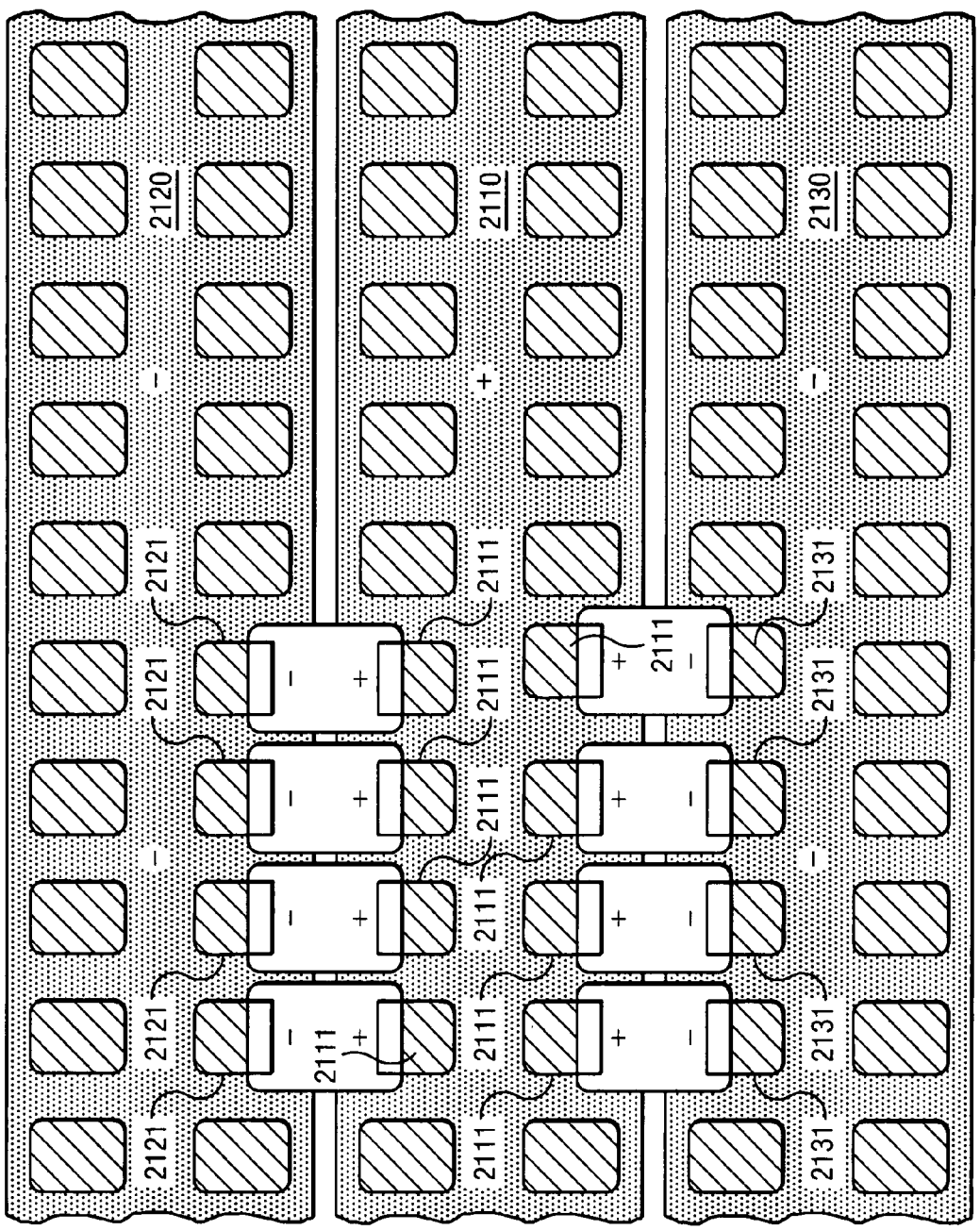
FIG. 21 depicts one embodiment of a pad structure suitable for use with the decoupling capacitor represented in FIGS. 20A and 20B.

FIG. 21 depicts one embodiment of a pad structure for use with decoupling capacitor 2000 in FIG. 20A. This pad structure is substantially similar to that disclosed in FIG. 19, however this embodiment may be used for coupling capacitors with only two terminals. Pad 2110 may have a positive polarity and at least two of pad openings 2111, while pad 2120 may have negative polarity and at least two pad openings 2121. In one particular embodiment, another pad 2130 may have negative polarity and at least two pad openings 2131. Pad openings 2111, 2121, 2131 within pads 2110–2130 may be arranged in two rows with each pad opening in each row adjacent to another pad in the same row and another pad opening in the other row.

Terminals 2001, 2002 of decoupling capacitor 2000 may attach to pad openings in one row of pad openings in one pad and pad openings in one row of pad openings in another pad with opposite polarity. For example, terminal 2002 may attach to pad openings 2111 of positive pad 2110 while terminal 2001 may attach to pad openings 2121 of positive pad 2120. By virtue of having shared pads 2110–2130 pad openings 2111, 2121 may be placed closer to one another allowing a higher density of decoupling capacitors 2000 to be attached to a substrate, and multiple capacitors may share the pad openings of a single pad.

Figure 22:
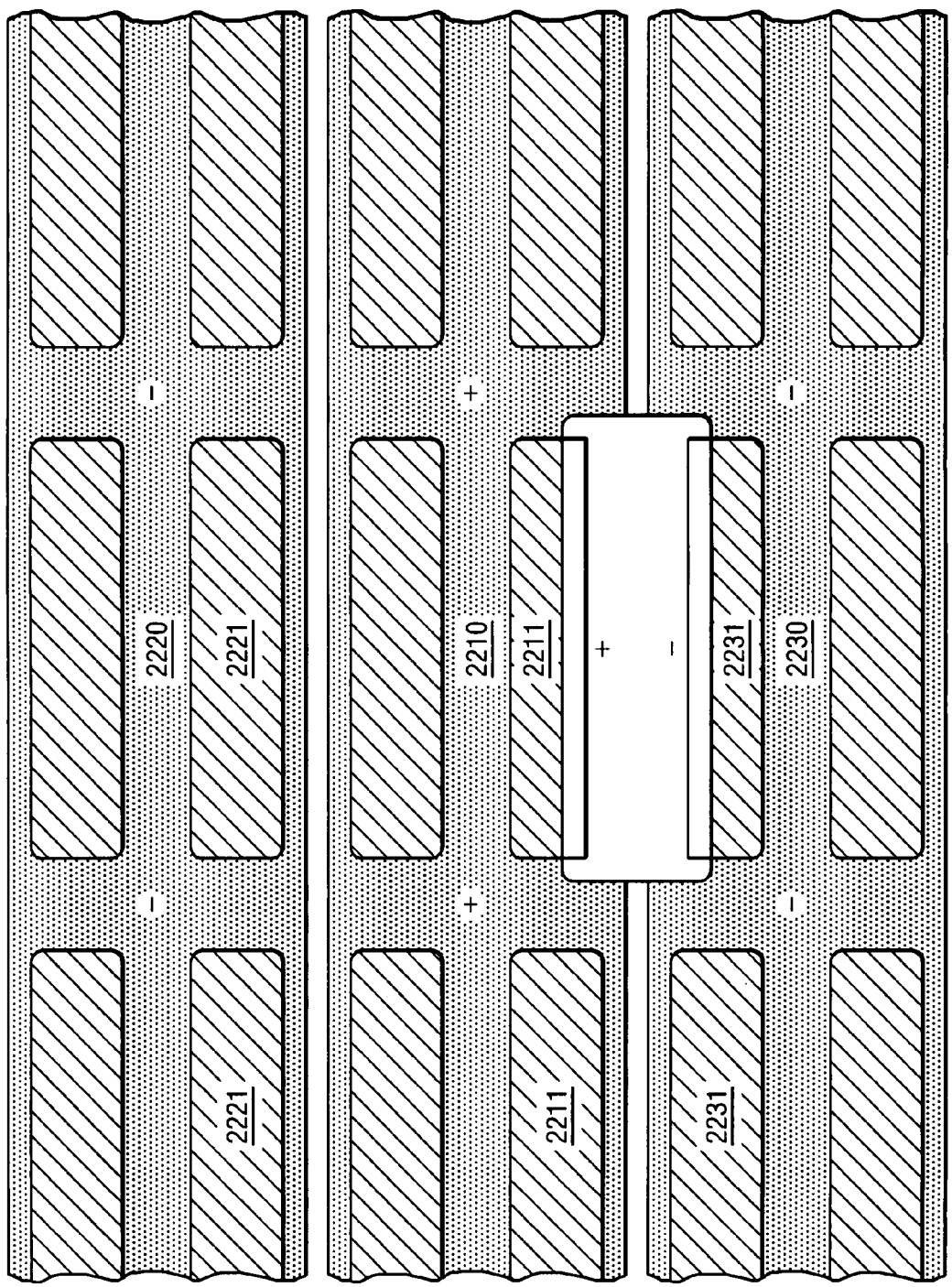
FIG. 22 depicts one embodiment of a pad structure suitable for use with the decoupling capacitor represented in FIGS. 20A and 20B.

FIG. 22 depicts an embodiment of a similar pad structure, with openings designed for use with decoupling capacitor 2000 of the type pictured in FIG. 20B. This pad structure is substantially similar to that disclosed in FIG. 21, however this embodiment may be utilized for coupling capacitors with longer terminals. Pad 2210 may have a positive polarity and at least two of pad openings 2211, while pad 2220 may have negative polarity and at least two pad openings 2221. In one particular embodiment, another pad 2230 may have negative polarity and at least two pad openings. Pad openings 2211, 2221, 2231 within pads 2210–2230 may be arranged in two rows with each pad opening in each row adjacent to another pad in the same row and another pad opening in the other row.

Terminals 2001, 2002 of decoupling capacitor 2000 may attach to pad openings in one row of pad openings in one pad and pad openings in one row of pad openings in another pad with opposite polarity. For example, terminal 2002 may attach to pad openings 2211 of positive pad 2210 while terminal 2001 may attach to pad openings 2121 of positive pad 2220. By virtue of having shared pads 2210–2230 pad openings 2211, 2221 may be placed closer to one another allowing a higher density of decoupling capacitors 2000 to be attached to a substrate, and multiple capacitors may share the pad openings of a single pad.

It will be clear to those of ordinary skill in art that pad structures of the type discussed may be tailored to utilize decoupling capacitors or devices of any layout or construction including those with more or fewer terminals, differing layouts or arrangements or polarities of terminals. A person of ordinary skill in the art will be capable of determining which structure, arrangement, capacitor type etc. will be best suited to a particular implementation.

In the foregoing specification, the invention has been described with reference to specific embodiments. However, various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A substrate layer for use with a semiconductor package, comprising:
    a first pad with at least two pad openings;
    a second pad with at least two pad openings wherein the second pad has a polarity opposite the first pad, wherein each pad opening is operable to couple a terminal of a capacitor;
    a set of rows of pads, each row of pads, comprising:
        the first pad having a polarity and four pad openings,
        a second pad proximate the first pad and having two pad openings,
        a third pad with two pad openings and the same polarity as the polarity of the first pad, wherein the third pad is proximate the second pad, and
        a fourth pad with four pad openings and a polarity opposite the polarity of the first pad, wherein the fourth pad is proximate the third pad, wherein the rows of pads are adjacent to each other such that each pad within a row is aligned with a corresponding pad in each adjacent row, and the corresponding pad in each adjacent row has an opposite polarity; and
    a first inderdigitated capacitor, having at least eight terminals wherein
        a first terminal connects to a first pad opening of the first pad of the first row;
        a second terminal proximate the first terminal and with a polarity opposite the first terminal is coupled to a first pad opening of the second pad of the first row;
        a third terminal proximate the second terminal and with a polarity opposite the second terminal is coupled to a first pad opening of the third pad of the first row;
        a fourth terminal proximate the third terminal and with a polarity opposite the first terminal is coupled to a first pad opening of the fourth pad of the first row;
        a fifth terminal proximate the fourth terminal and with a polarity opposite the fourth terminal is coupled to a first pad opening of the fourth pad of the second row;
        a sixth terminal proximate the fifth terminal and with a polarity opposite the fifth terminal is coupled to a first pad opening of the third pad of the second row;
        a seventh terminal proximate the sixth terminal and with a polarity opposite the sixth terminal is coupled to a first pad opening of the second pad of the second row; and
        an eighth terminal proximate the seventh terminal and with a polarity opposite the seventh terminal is coupled to a first pad opening of the first pad of the second row.

2. The substrate layer of claim 1, wherein each row further comprising a set of rows of pads, each row of pads comprising:
    a fifth pad with two pad openings and a polarity opposite the polarity of the fourth pad, wherein the fifth pad is proximate the fourth pad;
    a sixth pad with two pad openings and the same polarity as the polarity of the fourth pad, wherein the sixth pad is proximate the fifth pad; and
    a seventh pad with four pad openings and a polarity opposite the polarity of the sixth pad, wherein the seventh pad is proximate the sixth pad.

3. The substrate layer of claim 2 further comprising a second interdigitated capacitor, having at least eight terminals and point symmetry to the first capacitor wherein
    a first terminal of the second capacitor is coupled to a second pad opening of the fourth pad of the first row;
    a second terminal of the second capacitor proximate the first terminal of the second capacitor and with a polarity opposite the first terminal of the second capacitor is coupled to a first pad opening of the fifth pad of the first row;
    a third terminal of the second capacitor proximate the second terminal of the second capacitor and with a polarity opposite the second terminal of the second capacitor is coupled to a first pad opening of the sixth pad of the first row;
    a fourth terminal of the second capacitor proximate the third terminal of the second capacitor and with a polarity opposite the first terminal of the second capacitor is coupled to a first pad opening of the seventh pad of the first row;
    a fifth terminal of the second capacitor proximate the fourth terminal of the second capacitor and with a polarity opposite the fourth terminal of the second capacitor is coupled to a first pad opening of the seventh pad of the second row;
    a sixth terminal of the second capacitor proximate the fifth terminal of the second capacitor and with a polarity opposite the fifth terminal of the second capacitor is coupled to a first pad opening of the sixth pad of the second row;
    a seventh terminal of the second capacitor proximate the sixth terminal of the second capacitor and with a polarity opposite the sixth terminal is coupled to a first pad opening of the fifth pad of the second row; and
    an eighth terminal of the second capacitor proximate the seventh terminal of the second capacitor and with a polarity opposite the seventh terminal of the second capacitor is coupled to a second pad opening of the fourth pad of the second row.

4. The substrate layer of claim 1, wherein the first capacitor and the second capacitor are operable to suppress noise created by the operation of a semiconductor of the semiconductor package.

5. The substrate layer of claim 1, wherein each of the pads is formed in a solder resist layer of semiconductor package.

6. The substrate layer of claim 1, wherein each of the pads is coupled to a via of the semiconductor package.

7. The substrate layer of claim 1, wherein the first capacitor is operable to reduce noise during operation of the semiconductor of the semiconductor package.

8. The substrate layer of claim 1, wherein space between the pad openings is less than 100 microns.

9. The substrate layer of claim 1, wherein a solder mask is formed on each of the pads and each of the pad openings is formed in the solder mask on the pad.

* * * * *